(12) United States Patent
Tang et al.

(10) Patent No.: US 6,700,422 B2
(45) Date of Patent: Mar. 2, 2004

(54) APPARATUS FOR INCREASING SLEW RATE

(75) Inventors: Wing-Kai Tang, Hsinchu (TW);
Kuang-Feng Sung, Feng-Yuan (TW)

(73) Assignee: Novatek Microelectronics, Corp.,
Hsinchu (TW)

( * ) Notice: Subject to any disclaimer, the term of this patent is extended or adjusted under 35 U.S.C. 154(b) by 0 days.

(21) Appl. No.: 10/064,643

(22) Filed: Aug. 2, 2002

(65) Prior Publication Data

US 2004/0021491 A1 Feb. 5, 2004

(51) Int. Cl.[7] .................................................. H03K 5/12
(52) U.S. Cl. ........................ 327/170; 327/112; 327/374
(58) Field of Search .................... 327/108–112, 170, 327/374; 330/252, 253, 262

(56) References Cited

U.S. PATENT DOCUMENTS 5,467,035 A * 11/1995 Ohi et al. ...................... 327/94

* cited by examiner

Primary Examiner—Kenneth B. Wells
(74) Attorney, Agent, or Firm—Jiang Chyun IP Office

(57) ABSTRACT

The present invention provides an apparatus for increasing the slew rate. The apparatus for increasing the slew rate comprises an operational amplifier and a push-pull output stage. The present invention is operated under the principle of when there is a big difference between the output signal and the input signal, either the pull-up transistor or the pull-down transistor in the push-pull output stage is ON, so that the pushed or pulled current is provided to a load on the output terminal. When the difference between the output signal and the input signal becomes smaller, the operation of the push-pull output stage stops, and the load on the output terminal is directly driven by the operational amplifier at this time. Since the present invention only deploys an operational amplifier and a push-pull output stage and does not deploy error amplifier, the present invention reduces occupied area and saves consumed power, and also avoids offset voltage and oscillation problems.

17 Claims, 3 Drawing Sheets

APPARATUS FOR INCREASING SLEW RATE

BACKGROUND OF INVENTION

1. Field of Invention

The present invention generally relates to an apparatus for increasing the slew rate, and more particularly, to an apparatus that increases the slew rate, reduces the area used and saves power consumption.

2. Description of Related Art

The slew rate is defined as a time variation rate of the voltage output from the closed loop operational amplifier (OP AMP) when it is operated under a large signal condition. Generally speaking, when a user inputs the voltage to the input terminal of the operational amplifier, it is desired that the output terminal of the operational amplifier can rapidly reach a voltage level that is the same as the input voltage.

However, since the operation of the physical operational amplifier is limited by the slew rate, the output voltage does not reach the same level as the input voltage for a certain time period. For example, if the input voltage is 15V, and the slew rate of the operational amplifier is $0.5V/\mu s$, since the variation of the output voltage cannot exceed $0.5V/\mu s$, only after waiting for 30 $\mu s$, can the output voltage reach the desired 15V. Therefore, the performance of the operational amplifier can be improved by increasing the slew rate of the operational amplifier.

When the conventional operational amplifier is to drive a rather large load in capacitive type, in order to increase the slew rate, it usually needs to consume a large amount of static current to achieve the characteristic of high slew rate. For the description in clarity, as shown in FIG. 1, it is a drawing block diagram, schematically illustrating the conventional operation amplifier in two stages. In FIG. 1, the first stage amplifier 101 is input with a voltage Vin, which is converted into a current I in the first stage. The current I will compensate the capacitor $C_M$ for charging/discharging, so that the slew rate $SR=I/C_M$, and the slew rate is related with the first stage current of the operational amplifier. However, when the load is a large capacitor, if the driving ability at the second stage, i.e. output stage, is insufficient, then the slew rate cannot be described by the foregoing formula. Therefore, a second stage amplifier 102 is necessary to improve the driving ability. In this manner, it is necessary to increase the size of the second stage. This then causes an increase of the static current for the operation amplifier.

In order to reduce the static current consumption, a circuit diagram of a conventional apparatus for increasing the slew rate is shown in FIG. 2. From FIG. 2, the apparatus for increasing the slew rate 20 comprises an operational amplifier 202, an error amplifier 204, and a push-pull output stage (also known as a common source output stage) 206. The error amplifier 204 comprises an operational amplifier 208 and an operational amplifier 210. The push-pull output stage 206 comprises a transistor 212 and a transistor 214. The transistor 212 is a P type Metal-Oxide-Semiconductor (MOS) filed transistor, and a source of the transistor 212 couples to a positive voltage $V_{DD}$. The transistor 214 is an N type MOS filed transistor, and a source of the transistor 214 couples to the ground. The apparatus for increasing slew rate 20 is operated under the principle of when the output voltage $V_0$ is greater than the output voltage $V_1$ of the operational amplifier 202, the output voltage $V_2$ of the operational amplifier 208 turns on the transistor 212, and the output voltage $V_3$ of the operational amplifier 210 turns off the transistor 214. At this time, the transistor 212 pushes (also known as source) current into the output terminal. When the output voltage $V_0$ is smaller than the output voltage $V_1$ of the operational amplifier 202, the output voltage $V_2$ of the operational amplifier 208 turns off the transistor 212, and the output voltage $V_3$ of the operational amplifier 210 turns on the transistor 214. At this time, the transistor 214 pulls (also known as sink) current into the output terminal. Moreover, when the output voltage $V_0$ is equal to the output voltage $V_1$ of the operational amplifier 202, the output voltage $V_2$ of the operational amplifier 208 will bias the transistor 212 under a quiescent current Iq, and the output voltage $V_3$ of the operational amplifier 210 will bias the transistor 214 to Iq too. At this time, the output terminal is V0 equal to the output voltage $V_{O1}$ of the operational amplifier 202. Since the apparatus for increasing the slew rate 20 has to deploy operational amplifier 208 and operational amplifier 210, a greater area is used and a greater amount of the power is consumed, and it also generates offset voltage and oscillation problems.

SUMMARY OF INVENTION

Therefore, the present invention provides an apparatus for increasing the slew rate. Since the present invention only deploys an operational amplifier and a push-pull output stage and does not deploy the error amplifier, the present invention reduces occupied area and saves consumed power.

In order to achieve the objectives mentioned above and others, the present invention provides an apparatus for increasing the slew rate. The apparatus for increasing the slew rate comprises an operational amplifier, a pull-up transistor, and a pull-down transistor. The operational amplifier mentioned above comprises a non-inverting input terminal, an inverting input terminal, and an output terminal. The non-inverting input terminal receives an input signal, the inverting input terminal couples to the output terminal, and the output terminal generates an output signal. The pull-up transistor mentioned above comprises a first drain, a first gate, and a first source. The first drain couples to a supply voltage, the first gate couples to the non-inverting input terminal, and the first source couples to the output terminal. The pull-down transistor mentioned above comprises a second drain, a second gate, and a second source. The second drain couples to the ground, the second gate couples to the first gate and the non-inverting input terminal, and the second source couples to the first source and the output terminal.

In a preferred embodiment of the present invention, when the result voltage obtained from the output signal subtracted from the input signal is greater than or equal to the threshold voltage of the pull-up transistor and the result voltage obtained from the input signal subtracted from the output signal is less than the threshold voltage of the pull-down transistor, the pull-up transistor is ON and the pull-down transistor is OFF. At this time, the pull-up transistor pushes source current to the output terminal.

In a preferred embodiment of the present invention, when the result of the output signal subtracted from the input signal is less than the threshold voltage of the pull-up transistor, and the result of the input signal subtracted from the output signal is greater than or equal to the threshold voltage of the pull-down transistor, the pull-up transistor is OFF and the pull-down transistor is ON. At this time, the pull-down transistor pulls sinks current to the output terminal.

In a preferred embodiment of the present invention, when the result of the output signal subtracted from the input signal is less than the threshold voltage of the pull-up transistor, and the result of the input signal subtracted from the output signal is also less than the threshold voltage of the pull-down transistor, both the pull-up transistor and the pull-down transistor are OFF. At this time, the output terminal is driven by the operational amplifier.

In a preferred embodiment of the present invention, the pull-up transistor is an n type MOS field transistor, and the pull-down transistor is a p type MOS filed transistor.

In a preferred embodiment of the present invention, the pull-up transistor and the pull-down transistor constitute a push-pull output stage.

In a preferred embodiment of the present invention, the supply voltage is a positive voltage, and this positive voltage is provided by a power supply.

The present invention further provides an apparatus for increasing the slew rate. The apparatus for increasing the slew rate comprises an operational amplifier and a push-pull output stage. The operational amplifier mentioned above comprises a non-inverting input terminal, an inverting input terminal, and an output terminal. The non-inverting input terminal receives an input signal, the inverting input terminal couples to the output terminal, and the output terminal generates an output signal. The push-pull output stage mentioned above comprises an input terminal and an output terminal. The input terminal couples to the non-inverting input terminal, and the output terminal couples to the output terminal.

In a preferred embodiment of the present invention, the push-pull output stage comprises a pull-up transistor and a pull-down transistor. The pull-up transistor mentioned above comprises a first drain, a first gate, and a first source. The first drain couples to the supply voltage, the first gate couples to the non-inverting input terminal, and the first source couples to the output terminal. The pull-down transistor mentioned above comprises a second drain, a second gate, and a second source. The second drain couples to the ground, the second gate couples to the first gate and the non-inverting input terminal, and the second source couples to the first source and the output terminal In summary, since the present invention only deploys an operational amplifier and a push-pull output stage and does not deploy the error amplifier, the present invention reduces occupied area and saves consumed power, and also avoids the offset voltage and oscillation problems.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a circuit diagram of a conventional operational amplifier that drives a capacitive load.

DETAILED DESCRIPTION

Figure 1:
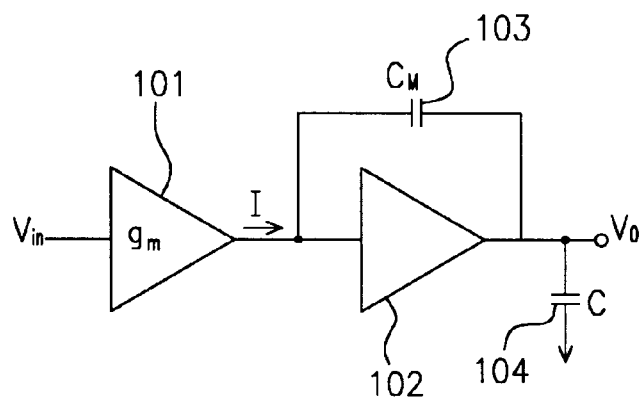
Figure 2:
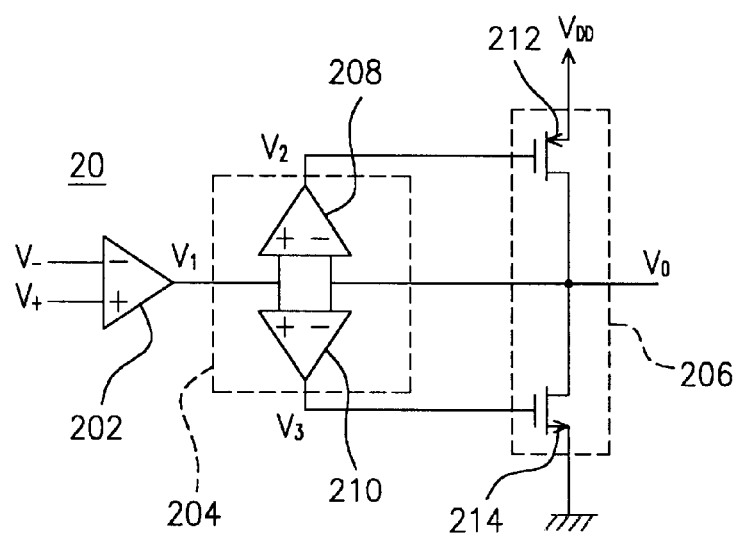
FIG. 2 schematically shows a circuit diagram of a conventional apparatus for increasing the slew rate.
Figure 3:
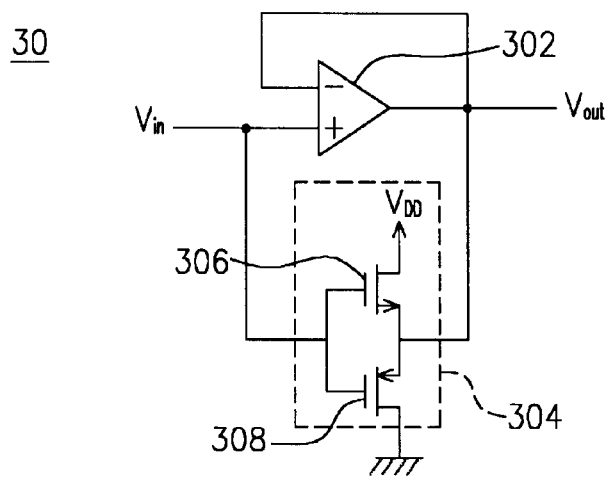
FIG. 3 schematically shows a circuit diagram of an apparatus for increasing the slew rate of a preferred embodiment according to the present invention.

FIG. 3 schematically shows a circuit diagram of an apparatus for increasing the slew rate 30 of a preferred embodiment according to the present invention. The apparatus for increasing the slew rate 30 comprises an operational amplifier 302 and a push-pull output stage 304. The push-pull output stage 304 comprises a pull-up transistor 306 and a pull-down transistor 308. The pull-up transistor is an n type MOS filed transistor, and the pull-down transistor is a p type MOS filed transistor. The structure of each element in the apparatus for increasing the slew rate 30 is described in detail hereinafter.

The operational amplifier 302 comprises a non-inverting input terminal, an inverting input terminal, and an output terminal. The pull-up transistor 306 comprises a drain, a gate, and a source. The pull-down transistor 308 comprises a drain, a gate, and a source. The non-inverting input terminal of the operational amplifier 302 receives an input signal, and jointly couples to the gate of the pull-up transistor 306 and the gate of the pull-down transistor 308. The inverting input terminal of the operational amplifier 302 jointly couples to the output terminal of the operational amplifier 302, the source of the pull-up transistor 306 and the source of the pull-down transistor 308. The output terminal of the operational amplifier 302 generates an output signal. The drain of the pull-up transistor 306 couples to a positive voltage $V_{DD}$ that is provided by a power supply. The drain of the pull-down transistor 308 couples to the ground. In addition, the output terminal of the operational amplifier 302 couples to a load, such as a capacitive load. To have a better understanding of the apparatus for increasing the slew rate 30, its operation principle is described in detail hereinafter.

When the rising input signal is input into the non-inverting input terminal of the operational amplifier 302, since the slew rate of the operational amplifier 302 is not big enough to have the output signal follow the input signal immediately, the push-pull output stage 304 detects the difference existing between the input signal and the output signal at this time. If the resultant voltage ($V_{in} V_{out}$) obtained from the output signal subtracted from the input signal is greater than or equal to the threshold voltage of the pull-up transistor 306 and the resultant voltage ($V_{out} V_{in}$) obtained from the input signal subtracted from the output signal is less than the threshold voltage of the pull-down transistor 308, the pull-up transistor 306 is ON and the pull-down transistor 308 is OFF. At this time, the pull-up transistor 306 pushes (also known as source) current to the output terminal of the operational amplifier 302, so that the voltage of the output signal $V_{out}$ increases rapidly. Afterwards, the push-pull output stage 304 continuously detects the difference between the input signal and the output signal. When the resultant voltage ($V_{in} V_{out}$) obtained from the output signal subtracted from the input signal is less than the threshold voltage of the pull-up transistor 306 and the resultant voltage ($V_{out} V_{in}$) obtained from the input signal subtracted from the output signal is less than the threshold voltage of the pull-down transistor 308, both the pull-up transistor 306 and the pull-down transistor 308 are OFF. At this time, the operational amplifier 302 continuously provides a pushed current to the output terminal of the operational amplifier 302 until the voltage of the output signal is equal to the voltage of the input signal ($V_{out}=V_{in}$).

When the falling input signal is input into the non-inverting input terminal of the operational amplifier 302, since the slew rate of the operational amplifier 302 is not big enough to have the output signal follow the input signal immediately, the push-pull output stage 304 detects a difference existing between the input signal and the output signal at this time. If the resultant voltage ($V_{in} V_{out}$) obtained from the output signal subtracted from the input signal is less the threshold voltage of the pull-up transistor 306 and the result voltage ($V_{out}\ V_{in}$) obtained from the input signal subtracted from the output signal is greater than or equal to the threshold voltage of the pull-down transistor 308, the pull-up transistor 306 is OFF and the pull-down transistor 308 is ON. At this time, the pull-down transistor 308 pulls (also known as sink) current to the output terminal of the operational amplifier 302, so that the voltage of the output signal $V_{out}$ increases rapidly. Afterwards, the push-pull output stage 304 continuously detects the difference between the input signal and the output signal. When the result voltage ($V_{in}\ V_{out}$) obtained from the output signal subtracted from the input signal is less than the threshold voltage of the pull-up transistor 306 and the result voltage ($V_{out}\ V_{in}$) obtained from the input signal subtracted from the output signal is less than the threshold voltage of the pull-down transistor 308, both the pull-up transistor 306 and the pull-down transistor 308 are OFF. At this time, the operational amplifier 302 continuously provides a pulled current to the output terminal of the operational amplifier 302 until the voltage of the output signal is equal to the voltage of the input signal ($V_{out}=V_{in}$).

From the description mentioned above, since the present invention only deploys an operational amplifier and a push-pull output stage and does not deploy the error amplifier, the present invention reduces occupied area and saves consumed power, and also avoids the offset voltage and oscillation problems.

In summary, the present invention has following advantages:

1. Only an operational amplifier and a push-pull output stage are needed.

2. The error amplifier is not need to be deployed, thus the present invention reduces occupied area and saves consumed power, and also avoids the offset voltage and oscillation problems.

3. It can be directly applied to the currently used operational amplifier due to its simplified structure.

4. The original characteristic of the operational amplifier is also kept.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. An apparatus for increasing the slew rate, comprising:
    an operational amplifier, having a non-inverting input terminal, an inverting input terminal, and an output terminal, wherein the non-inverting input terminal receives an input signal, the inverting input terminal couples to the output terminal, and the output terminal generates an output signal;
    a pull-up transistor, having a first drain, a first gate, and a first source, wherein the first drain couples to a first supply voltage, the first gate couples to the non-inverting input terminal, and the first source couples to the output terminal; and
    a pull-down transistor, having a second drain, a second gate, and a second source, wherein the second drain couples to the ground, the second gate jointly couples to the first gate and the non-inverting input terminal, and the second source jointly couples to the first source and the output terminal.

2. The apparatus for increasing the slew rate of claim 1, wherein when a result voltage obtained from the output signal subtracted from the input signal is greater than or equal to a threshold voltage of the pull-up transistor and a result voltage obtained from the input signal subtracted from the output signal is less than a threshold voltage of the pull-down transistor, the pull-up transistor is ON and the pull-down transistor is OFF, at this time, the pull-up transistor pushes a current to the output terminal.

3. The apparatus for increasing the slew rate of claim 1, wherein when a result voltage obtained from the output signal subtracted from the input signal is less than a threshold voltage of the pull-up transistor and a result voltage obtained from the input signal subtracted from the output signal is greater than or equal to a threshold voltage of the pull-down transistor, the pull-up transistor is OFF and the pull-down transistor is ON, at this time, the pull-down transistor pulls a current to the output terminal.

4. The apparatus for increasing the slew rate of claim 1, wherein when a result voltage obtained from the output signal subtracted from the input signal is less than a threshold voltage of the pull-up transistor and a result voltage obtained from the input signal subtracted from the output signal is less than a threshold voltage of the pull-down transistor, both the pull-up transistor and the pull-down transistor are OFF.

5. The apparatus for increasing the slew rate of claim 4, wherein the output terminal is driven by the operational amplifier.

6. The apparatus for increasing the slew rate of claim 1, wherein the pull-up transistor is an n type MOS field transistor.

7. The apparatus for increasing the slew rate of claim 1, wherein the pull-down transistor is a p type MOS field transistor.

8. The apparatus for increasing the slew rate of claim 1, wherein the pull-up transistor and the pull-down transistor constitute a push-pull output stage.

9. The apparatus for increasing the slew rate of claim 1, wherein the supply voltage is a positive voltage, and the positive voltage is provided by a power supply.

10. A apparatus for increasing the slew rate comprises:
    an operational amplifier, having a non-inverting input terminal, an inverting input terminal, and an output terminal, wherein the non-inverting input terminal receives an input signal, the inverting input terminal couples to the output terminal, and the output terminal generates an output signal; and
    a push-pull output stage, input terminal and an output terminal, wherein the input terminal couples to the non-inverting input terminal, and the output terminal couples to the output terminal, wherein the push-pull output stage comprising:
    a pull-up transistor, having a first drain, a first gate, and a first source, wherein the first drain couples to a first supply voltage, the first gate couples to the non-inverting input terminal, and the first source couples to the output terminal; and
    a pull-down transistor, having a second drain, a second gate, and a second source, wherein the second drain couples to the ground, the second gate jointly couples to the first gate and the non-inverting input terminal, and the second source jointly couples to the first source and the output terminal.

11. The apparatus for increasing the slew rate of claim 10, wherein when a resultant voltage obtained from the output signal subtracted from the input signal is greater than or equal to a threshold voltage of the pull-up transistor and a resultant voltage obtained from the input signal subtracted from the output signal is less than a threshold voltage of the pull-down transistor, the pull-up transistor is ON and the pull-down transistor is OFF, at this time, the pull-up transistor pushes a current to the output terminal.

12. The apparatus for increasing the slew rate of claim 10, wherein when a resultant voltage obtained from the output signal subtracted from the input signal is less than a threshold voltage of the pull-up transistor and a resultant voltage obtained from the input signal subtracted from the output signal is greater than or equal to a threshold voltage of the pull-down transistor, the pull-up transistor is OFF and the pull-down transistor is ON, at this time, the pull-down transistor pulls a current to the output terminal.

13. The apparatus for increasing the slew rate of claim 10, wherein when a resultant voltage obtained from the output signal subtracted from the input signal is less than a threshold voltage of the pull-up transistor and a resultant voltage obtained from the input signal subtracted from the output signal is less than an threshold voltage of the pull-down transistor, both the pull-up transistor and the pull-down transistor are OFF.

14. The apparatus for increasing the slew rate of claim 13, wherein the output terminal is driven by the operational amplifier.

15. The apparatus for increasing the slew rate of claim 10, wherein the pull-up transistor is an n type MOS field transistor.

16. The apparatus for increasing the slew rate of claim 10, wherein the pull-down transistor is a p type MOS field transistor.

17. The apparatus for increasing the slew rate of claim 10, wherein the supply voltage is a positive voltage, and the positive voltage is provided by a power supply.

\* \* \* \* \*